United States Patent [19]
Adachi

[11] Patent Number: 5,251,155
[45] Date of Patent: Oct. 5, 1993

[54] SYSTEM IDENTIFICATION APPARATUS USING SPECTRUM ANALYSIS OF RESONATION FREQUENCIES

[75] Inventor: Shuichi Adachi, Kanagawa, Japan

[73] Assignee: Kabushiki Kaisha Toshiba, Kawasaki, Japan

[21] Appl. No.: 644,380

[22] Filed: Jan. 23, 1991

[30] Foreign Application Priority Data

Jan. 24, 1990 [JP] Japan .................................. 2-12442

[51] Int. Cl.⁵ .......................................... G06F 15/20;
[52] U.S. Cl. ..................................... 364/553; 244/164
[58] Field of Search ............... 364/553, 565, 566, 559, 364/434, 572, 576; 244/164, 165, 166, 167, 168, 169; 324/615

[56] References Cited

U.S. PATENT DOCUMENTS 3,090,583  5/1963  Behun et al. ...................... 364/559
4,646,227  2/1987  Corbin et al. ..................... 364/553

OTHER PUBLICATIONS

Eykhoff, "System Identification," John Wiley & Sons, 1974, pp. 66-73, no month.
Vaidyanathan, "Design and Implementation of Digital FIR Filters," Handbook of Digital Signal Processing, Academic Press, Inc., 1987, pp. 55-67, no month.

Primary Examiner—Jack B. Harvey
Assistant Examiner—Ellis B. Ramirez
Attorney, Agent, or Firm—Foley & Lardner

[57] ABSTRACT

A system identification apparatus determines a transfer function of an object to be identified for input and output signals. Predetermined frequency bands of the input and output signals are sampled through band-pass filters, and the transfer function is calculated according to a method of least squares. A characteristic part of the transfer function is found from the spectrum of the differential of the output signal, and passbands of the band-pass filters are determined to include the characteristic part.

6 Claims, 8 Drawing Sheets

FIG. 5 (a) INPUT SIGNAL
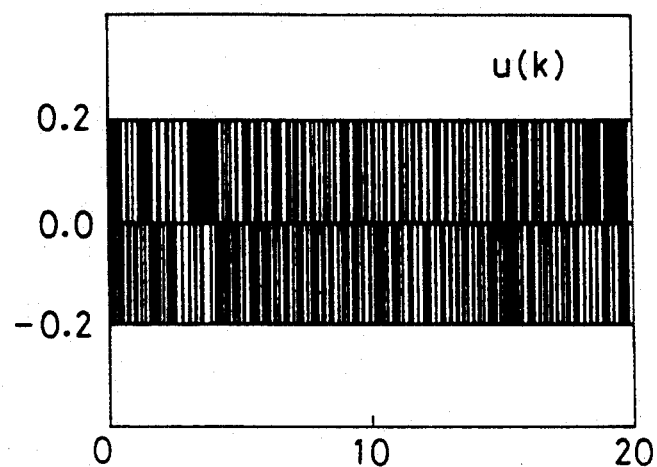
FIG. 5 (b) OUTPUT SIGNAL
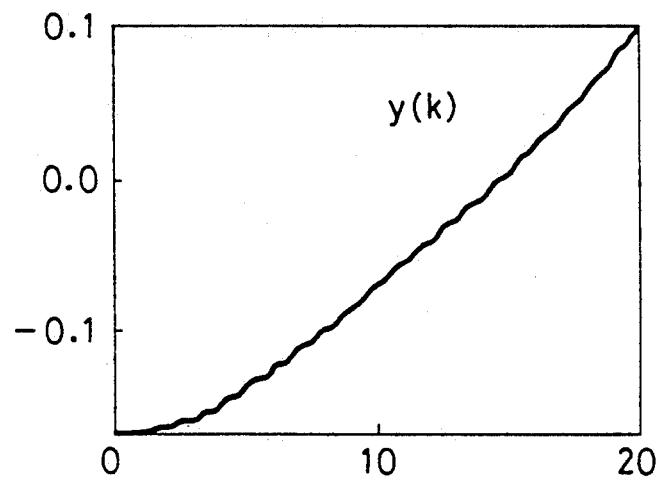
FIG. 5 (c) ACCELEROMETER OUTPUT
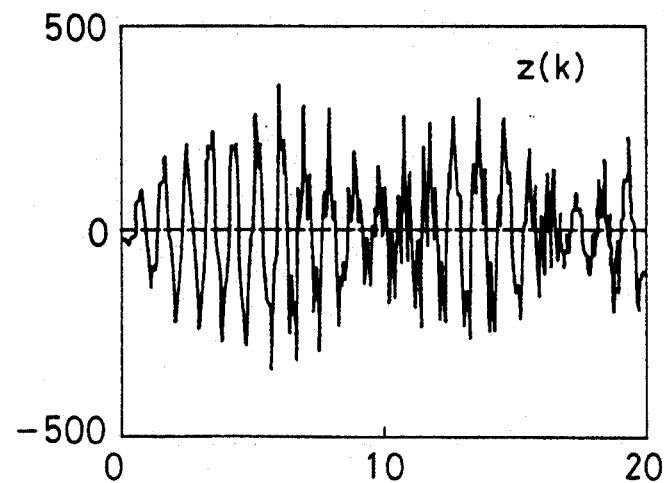

GAIN RESPONSE

PHASE RESPONSE

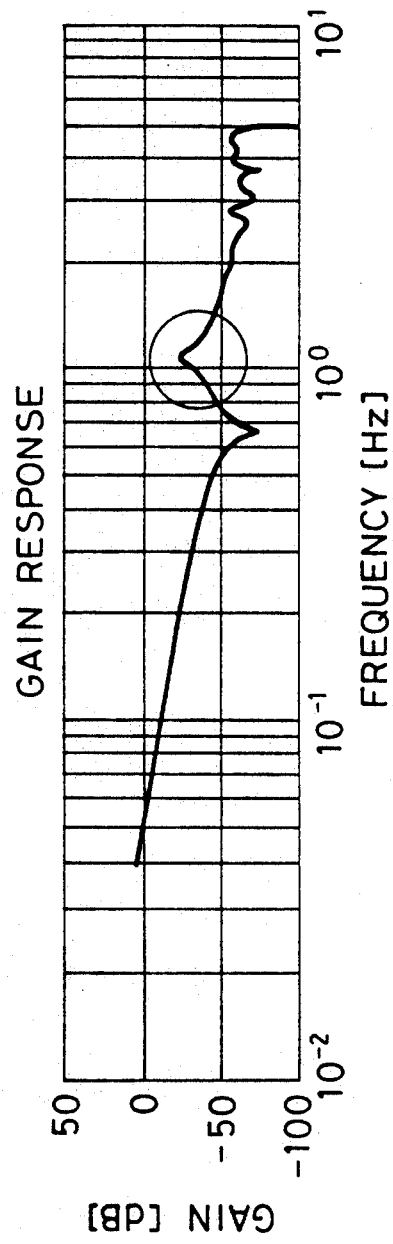
FIG.9 (a) GAIN RESPONSE
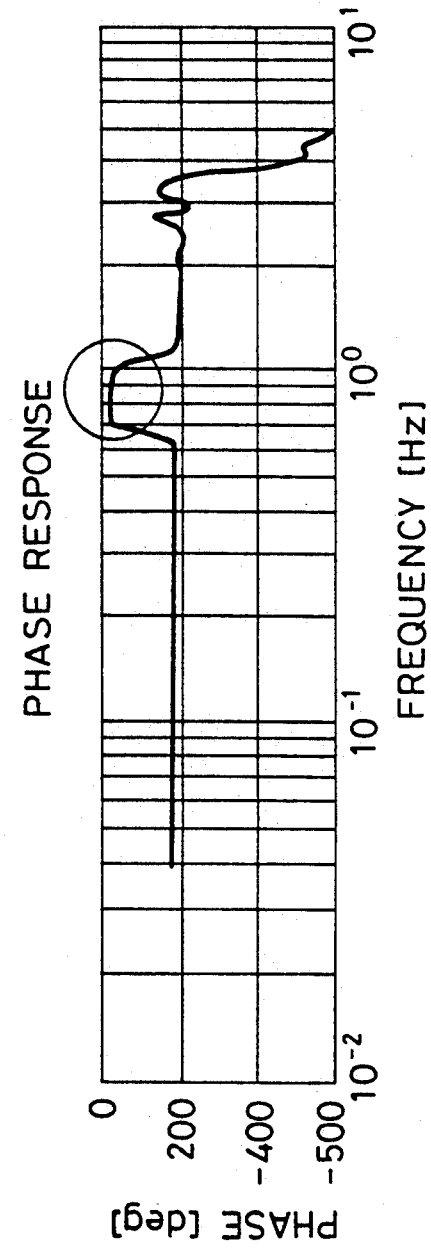
FIG.9 (b) PHASE RESPONSE

SYSTEM IDENTIFICATION APPARATUS USING SPECTRUM ANALYSIS OF RESONATION FREQUENCIES

BACKGROUND OF THE INVENTION

1. Field of the Invention

The present invention relates to a system identification apparatus for identifying a system such as an attitude control system of an artificial satellite.

2. Description of the Prior Art

The typical system identification apparatus employs, for example, a frequency response method in identifying dynamic characteristics of a system. The frequency response method is based on a fact that sine wave input and output signals received and outputted by a control system to be identified have the same frequency. Gain and phase characteristics of the control system with respect to the frequency are found from this fact.

Some system identification apparatuses directly find such frequency characteristics according to a fast Fourier transform (FFT) method. The FFT method is effective only when there is less observation noise and ineffective when there is so much observation noise that it may deteriorate the identification accuracy of the FFT method.

To improve the identification accuracy of the FFT method, one method has been proposed. This method averages the influence of the observation noise, identifies parameters of an objective control system in a time domain according to the method of least squares and, according to the identified parameters, calculates the frequency characteristics of the control system.

Even with the FFT method, it is difficult to identify the characteristics of a control system of, for example, an artificial satellite that is bulky and light in weight and has oscillation characteristics involving many oscillation modes of poor attenuation. In particular, the oscillation mode of port attenuation has a resonance point and an antiresonance point having entirely different energy levels and, therefore, is difficult to identify.

In an oscillation system, a signal energy level drastically differs in a rigid mode and an oscillating mode of the system. This is the reason why it is difficult to numerically identify characteristics of the oscillation system.

To identify characteristics of such an oscillation system, one identification apparatus has been proposed. This apparatus does not identify characteristics of the system for an entire frequency band at a time but divides the frequency band into several sections through a plurality of band-pass filters having different passbands, and applies the method of least squares for each of the frequency band sections, thereby identifying characteristics of each of the frequency band sections of the control system. This apparatus can accurately identify characteristics of an oscillating mode of the control system, but there is a problem in empirically selecting the plurality of band-pass filters having different passbands. This empirical selection prevents an improvement in the accuracy of identification of the apparatus. In addition, this apparatus takes a long time for identification.

As described above, the apparatus employing the FFT method hardly identifies characteristics of a control system accurately when there is a great deal of observation noise. The averaging method may reduce the influence of the observation noise in identifying the characteristics of a control system in a time domain. The averaging method, however, is not applicable, as it is, for accurately identifying characteristics of a control system such as an artificial satellite that is bulky and light weight and has oscillation characteristics involving many oscillation modes of poor attenuation.

To accurately identify characteristics of such oscillation modes of the system, it may be effective to properly select band-pass filters to identify characteristics of each frequency band of the system. The band-pass filters, however, must be selected empirically, thereby hindering an improvement of accuracy. In addition, this method takes a long time for identification.

SUMMARY OF THE INVENTION

An object of the present invention is to provide a system identification apparatus that can accurately and speedily identify oscillation characteristics of a control system involving many oscillation modes of poor attenuation.

To achieve the object, a system identification apparatus according to the present invention comprises an identification signal input unit for inputting an identification signal to an object to be identified; an input-and-output signal processing unit for receiving through a filter an input signal from the object and sampling the signal at a predetermined sampling period; a frequency characteristics calculating unit for identifying frequency characteristics of the input and output signals passed through the filter; a transfer function determining unit for determining a transfer function of the object; a spectrum analyzing means for analyzing a spectrum of data such as acceleration, velocity, and position of the object; a filter determining unit for determining a passband of the filter according to a result of the spectrum analysis; and a sampling period determining unit for determining the sampling period according to the determined filter passband.

In the above arrangement of the present invention, input and output signals of an object to be identified are provided to the filter having a predetermined passband, and sampled at a predetermined sampling period. In determining the passband of the filter, a spectrum of data such as acceleration, velocity, and position (angle) of the object to be identified is analyzed, and according to a result of the spectrum analysis, the filter determining unit determines the passband of the filter. According to the determined passband of the filter, the sampling period determining unit determines the sampling period. The frequency characteristics calculating unit identifies frequency characteristics of the input and output signals passed through the filter, and the transfer function determining unit calculates frequency characteristics and determines a transfer function of the object to be identified.

A sampling period is twice an upper limit of each filter band. A calculable lower limit of a frequency is usually about one hundredth of an upper limit of the frequency. A filter passband and sampling period, therefore, must be determined according to such conditions.

These and other objects, features and advantages of the present invention will be more apparent from the following detailed description of preferred embodiments in conjunction with the accompanying drawings.

BRIEF DESCRIPTION OF THE DRAWINGS

FIG. 5(a), 5(b), and 5(c) are views showing input and output signals to and from a system to be identified, and an output signal of such as an accelerometer of the system;

FIGS. 9(a) and 9(b) are graphs showing results of identification according to the present invention.

DETAILED DESCRIPTION OF THE EMBODIMENTS

Figure 1:
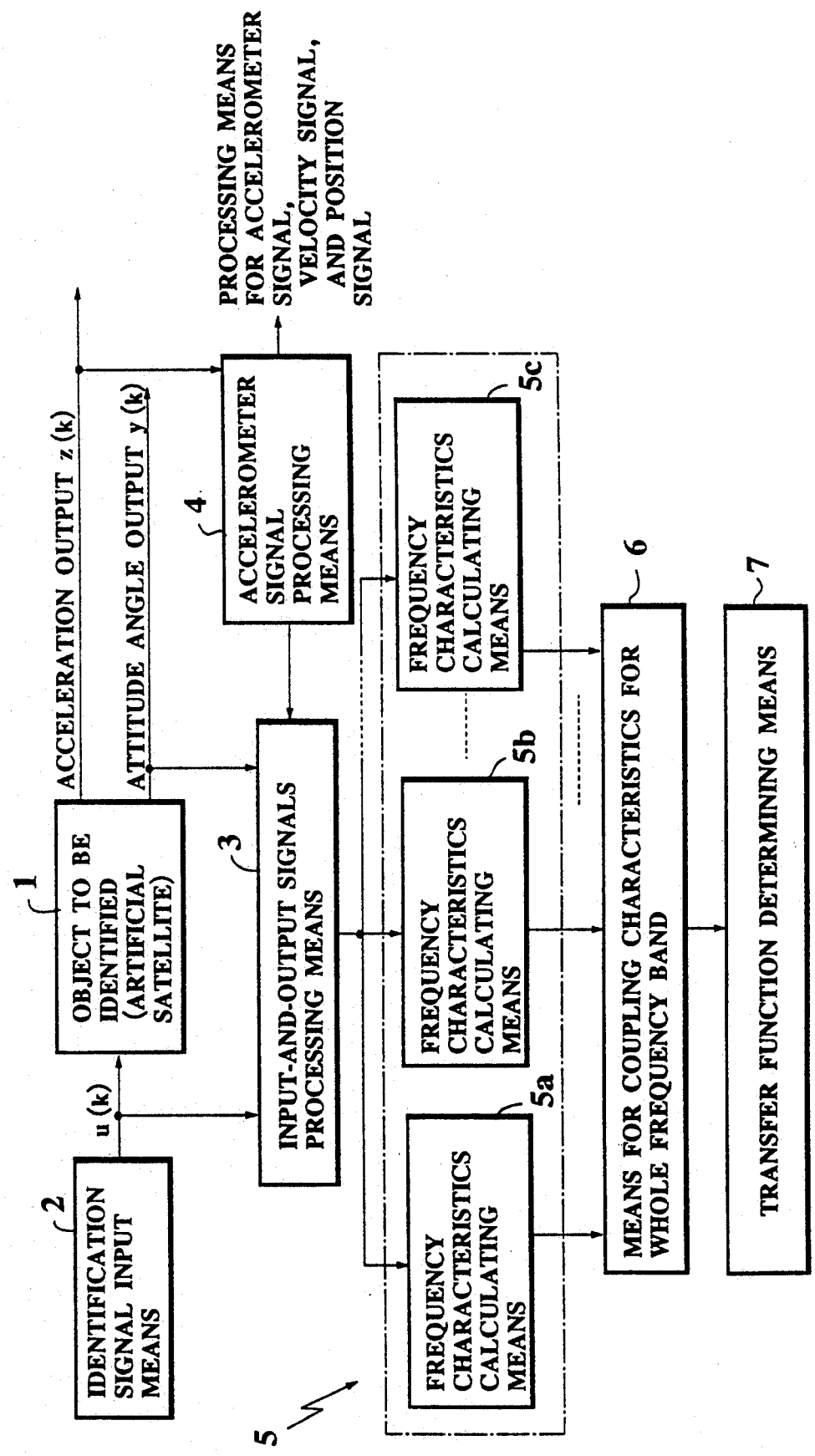
FIG. 1 is a block diagram schematically showing an embodiment o the present invention.

FIG. 1 is a block diagram showing an embodiment of the present invention. A system identification apparatus of FIG. 1 comprises an identification signal input unit 2 for providing an input signal to an object 1 to be identified, an input-and-output signals processing unit 3, an accelerometer, velocity, or position signal processing unit 4, a frequency characteristics calculating unit 5, a coupling unit 6, and a transfer function determining unit 7.

The object 1 to be identified is, for example, an attitude control system of an artificial satellite. The identification signal input unit 2 provides an identification signal that is an M-sequence signal, e.g., a torque input signal u(k), to the attitude control system of the object 1.

The input-and-output signals processing unit 3 receives in parallel the torque input signal u(k) given to the object 1 and an attitude angle output signal y(k) provided by the object 1 through a plurality of filters having different passbands, and samples the signals at different sampling periods.

The accelerometer, velocity, or position signal processing unit 4 receives for example, an accelerometer output signal z(k), and determines the cutoff frequencies and sampling periods of the filters of the input-and-output signals processing unit 3.

The frequency characteristics calculating unit 5 receives signals from the input-and-output signals processing unit 3 and calculates the frequency characteristics of each frequency band of the received signals.

The coupling unit 6 couples the frequency characteristics of the respective frequency bands calculated by the frequency characteristics calculating unit 5.

The transfer function determining unit 7 determines a transfer function of the object 1 to be identified, according to the frequency characteristics coupled by the coupling unit 6.

Figure 2:
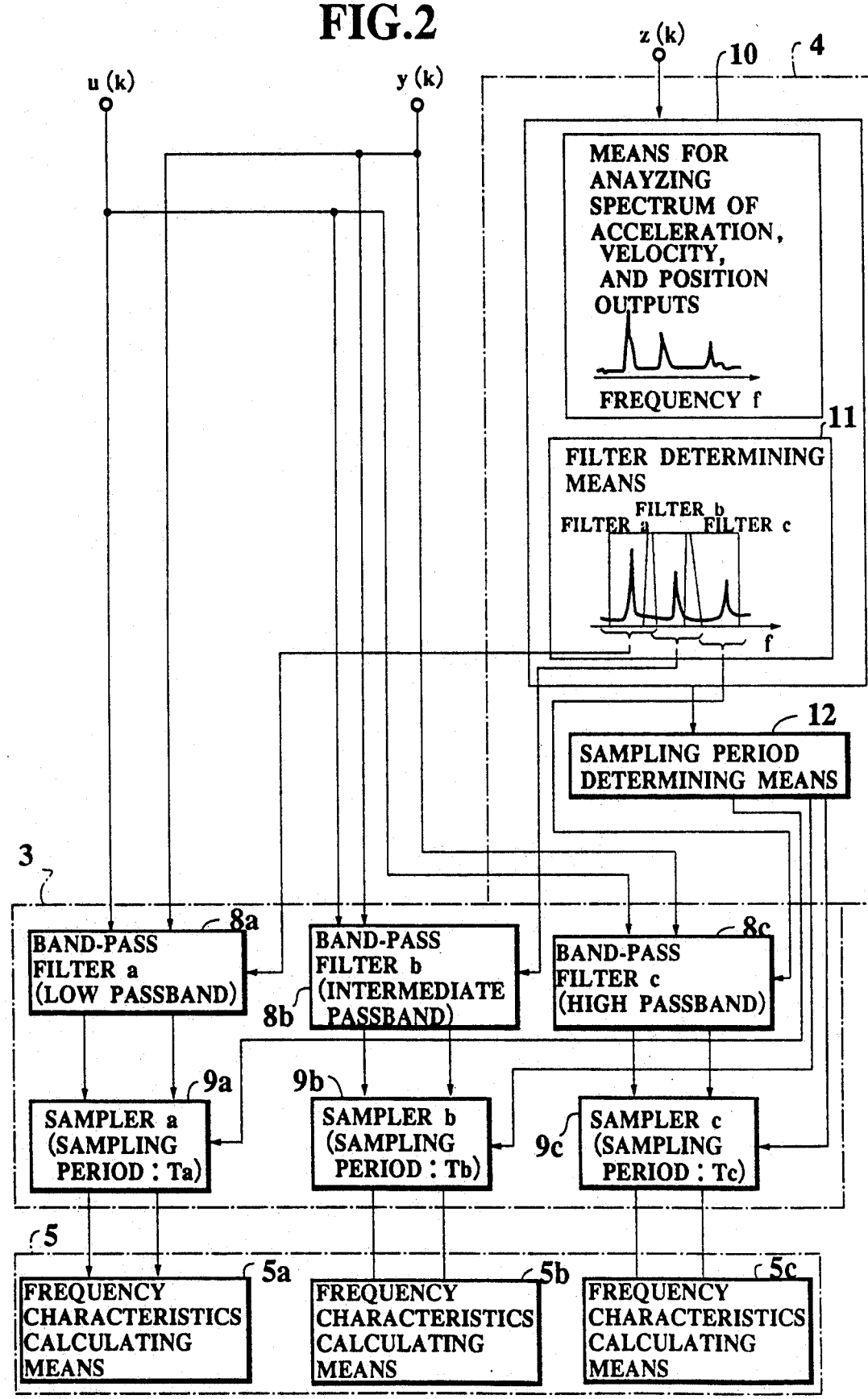
FIG. 2 is a block diagram showing the details of the embodiment.

FIG. 2 shows the details of the system identification apparatus of FIG. 1. The input-and-output signals processing unit 3 comprises three band-pass filters 8a, 8b, and 8c arranged in parallel with one another, and three samplers 9a, 9b, and 9c arranged in parallel with one another an having three different sampling periods. The band-pass filter 8a is for passing a low frequency band, the band-pass filter 8b for passing an intermediate frequency band, and the band-pass filter 8c for passing a high frequency band. The sampler 9a has a sampling period of $\Delta$ Ta, the sampler 9b of $\Delta$ Tb, and the sampler 9c of $\Delta$ Tc.

The numbers of the band-pass filters and samplers are not limited to each three but may be more than three that are arranged in parallel with one another.

The accelerometer, velocity, or position signal processing unit 4 comprises a spectrum analyzer 10, a filter determining unit 11, and a sampling period determining unit 12.

The spectrum analyzer 10 receives the output signal z(k) of the accelerometer for example, and analyzes a spectrum of the signal according to, for example, a fast Fourier transform (FFT) method, as shown in FIG. 2. The FFT method uses an algorism disclosed in pages 66 to 73 of SYSTEM IDENTIFICATION of Pieter Eykhoff for JOHN WILEY & SONS.

According to a result of the spectrum analysis, the filter determining unit 11 determines passbands (cutoff frequencies) of the band-pass filters 8a, 8b, and 8c. The band-pass filters 8a, 8b, and 8c are designed with a method disclosed in pages 55 to 67 of Handbook of digital signal processing for ACADEMIC PRESS, INC..

The sampling period determining unit 12 determines the sampling periods $\Delta$ Ta, $\Delta$ Tb, and $\Delta$ Tc of the samplers 9a, 9b, and 9c, according to the determined passbands of the band-pass filters.

The input-and-output signals processing unit 3 receives the input signal u(k) and output signal y(k) in parallel through the band-pass filters 8a, 8b, and 8c. Through these band-pass filters, the signals are divided into frequency bands. The frequency bands are sampled by the samplers 9a, 9b, and 9c at the sampling periods $\Delta$ Ta, $\Delta$ Tb, and $\Delta$ Tc.

The frequency characteristics calculating unit 5a, 5b, and 5c receive the sampled frequency bands respectively, and calculates the frequency characteristics of the respective frequency bands. For example, as shown in FIG. 3(a), the frequency characteristics calculating unit 5a provides a frequency band "a," the frequency characteristics calculating unit 5b a frequency band "b," and the frequency characteristics calculating unit 5c a frequency band "c."

Figure 3:
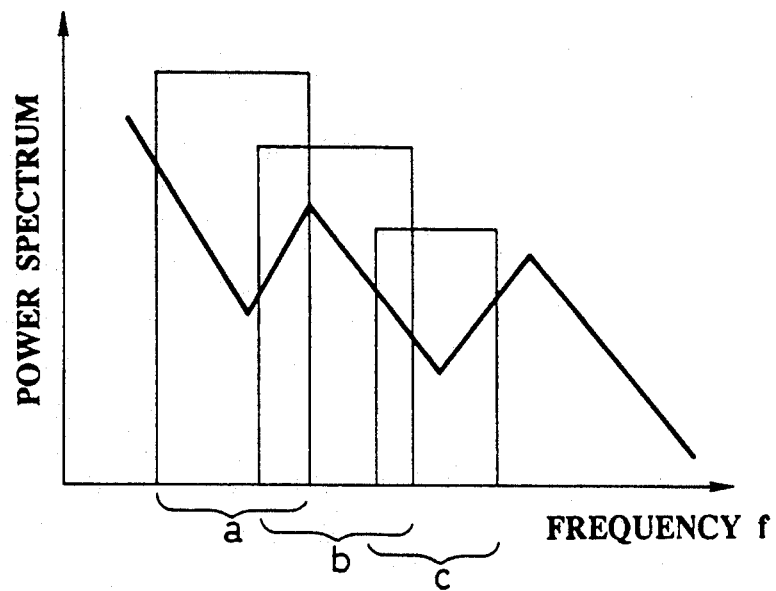
FIG. 3(a) and 3(b) are views showing an operation of the embodiment.
Figure 3:
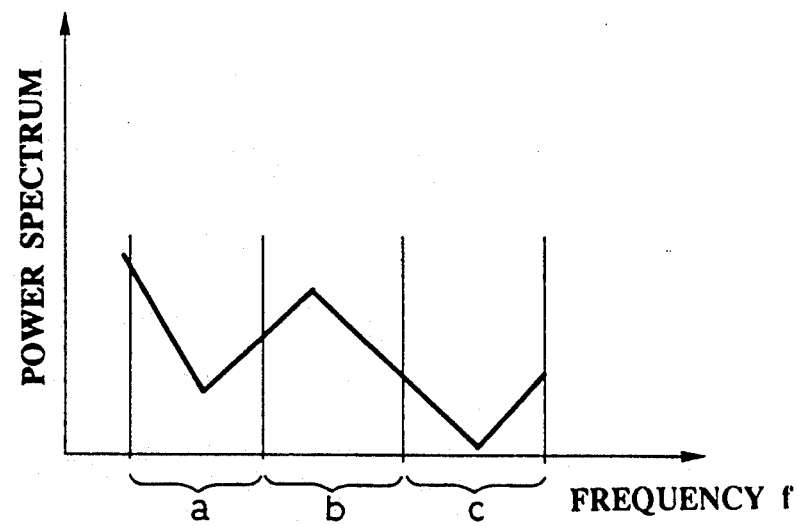

The coupling unit 6 couples these frequency bands a, b, and c together as shown in FIG. 3(b). According to the coupled frequency bands, the transfer function determining unit 7 determines a transfer function of the object 1 to be identified.

Figure 4:
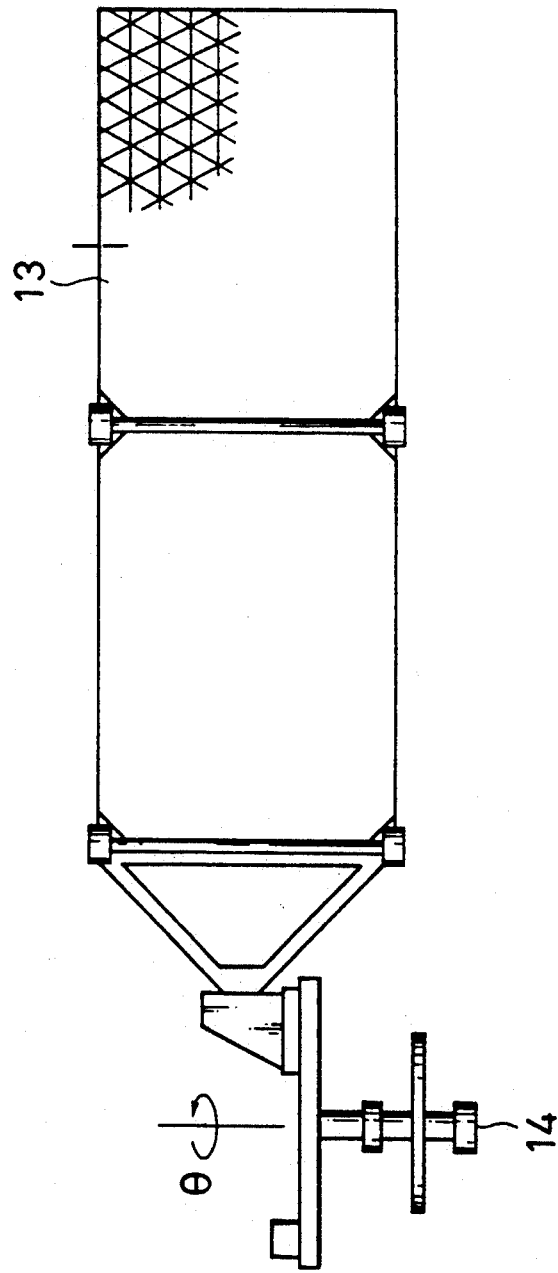
FIG. 4 is a schematic view showing a model of a solar battery paddle.

FIG. 4 shows a model of a solar battery paddle employed by a large artificial satellite for which the system identification apparatus of the present invention is applicable. This model has a light-weight flexible panel 13 having many oscillation modes, and a DC motor 14 for turning the panel 13 to control the panel to a predetermined angle $\theta$.

It is required to slowly turn and stop the panel 13 and smoothly control the panel 13 so that the artificial satellite proper and the panel 13 may not interfere with each other. To achieve this, an M-sequence signal is provided to the DC motor 14, and an attitude angle of the flexible panel 13 is obtained as an output signal. An accelerometer is disposed at an end of the panel 13 to provide a signal z. These signals are the input and output signals u(k) and y(k) and the accelerometer output signal z(k) shown in FIG. 2.

Figure 6:
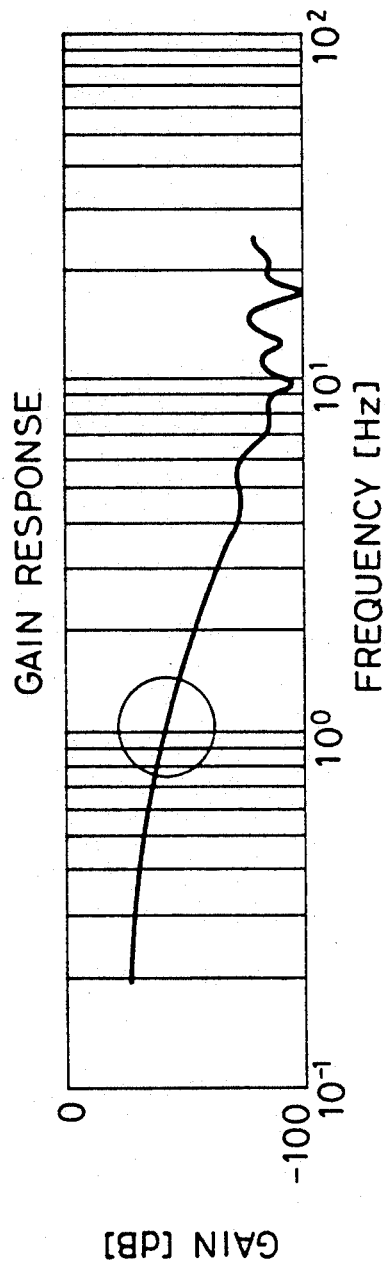
FIGS. 6(a) and 6(b) are graphs showing the results of identification of frequency characteristics of the model of FIG. 4 by directly applying a method of least squares according to a prior art.
Figure 6:
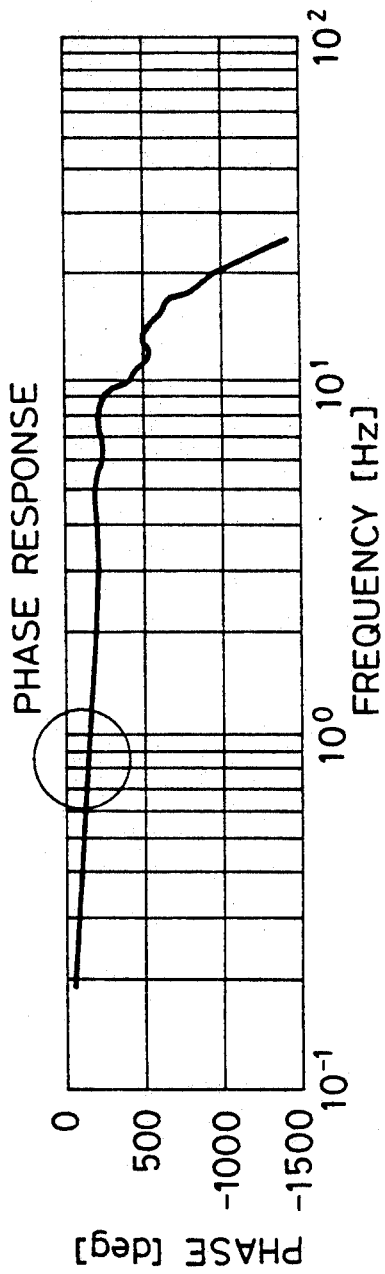

FIGS. 5(a), 5(b), and 5(c) show examples of the signals u(k), y(k), and z(k), respectively. If the method of least squares is applied for the input and output signals u(k) and y(k) of FIGS. 5(a) and 5(b) to identify characteristics of the system of the artificial satellite, results (frequency characteristics) will be frequency-gain characteristics of FIG. 6(a) and frequency-phase characteristics of FIG. 6(b).

The object to be identified in FIG. 4 has oscillation modes at 1 Hz and 4 Hz. It is impossible to identify this 1 Hz in FIGS. 6(a) and 6(b) in which an area around the 1 Hz is encircled.

On the other hand, if the accelerometer output signal z(k) for example is power-spectrum-analyzed to determine the frequency bands of filters and the sampling periods of samplers, it is possible to accurately identify the oscillation modes.

Figure 7:
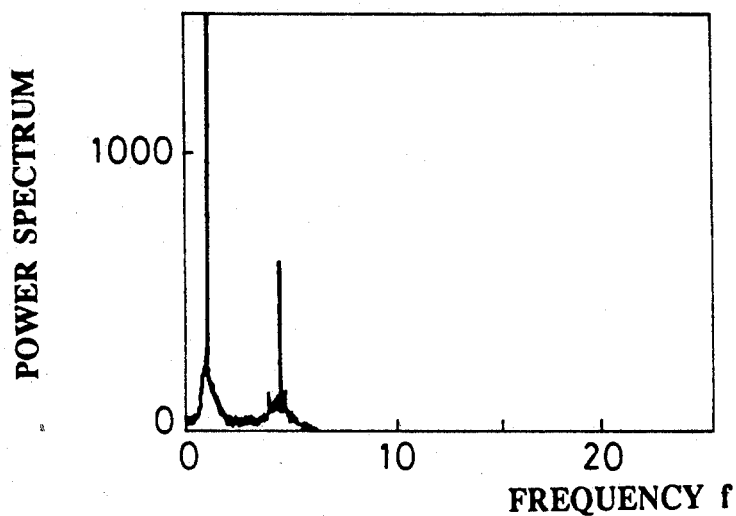
FIG. 7 is a graph showing a result of spectrum analysis of the model of FIG. 4, according to the present invention.

Namely, FIG. 7 is a graph showing a result of the power spectrum analysis of the accelerometer output signal z(k) of FIG. 5(c) according to the FFT method. Since the accelerometer output signal z(k) especially includes many pieces of information related to oscillation components, it is possible to identify the oscillation frequencies around 1 Hz and 4 Hz. However, it is not limited to use of the accelerometer output signal. A velocity signal or position (angle) signal also be used.

Figure 8:
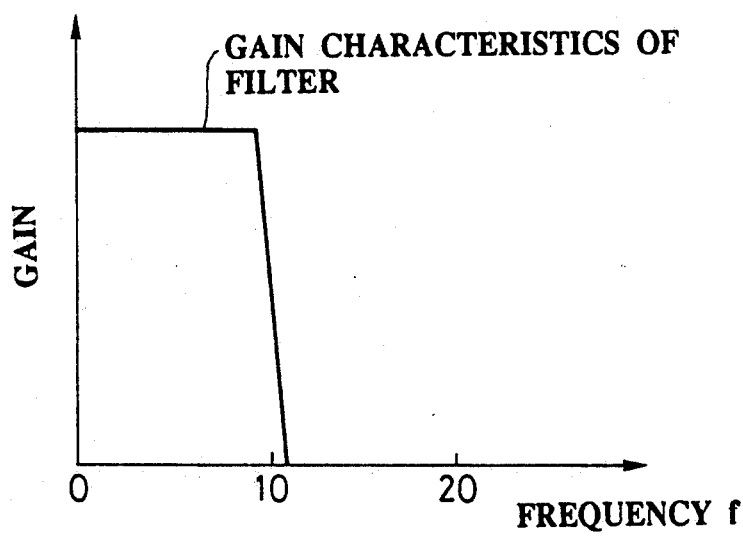
FIG. 8 is a graph showing characteristics of a filter.

In this way, the accelerometer, velocity, or position signal processing unit 4 can roughly identify the frequency of each oscillation mode of the artificial satellite and design a band-pass filter as shown in FIG. 8. Unlike the embodiment of FIG. 1 and 2, the case of FIG. 8 has only one band-pass filter. A cutoff frequency of the filter of FIG. 8 is set at 10 Hz, and according to the cutoff frequency, a sampling period of a sampler may be determined as, for example, 20 Hz. The input and output signals passed through the filter and sampler are processed by the method of least squares, thereby accurately identifying the attitude control system, strongly against observation noise. FIGS. 9(a) and 9(b) shows results of the identification. As encircled in the figures, a primary oscillation mode around 1 Hz is accurately identified.

In the example of FIGS. 8 and 9, only one filter is used for identification. If oscillation modes exist widely in a frequency band, a plurality of filters may be used as in the embodiment of FIGS. 1 and 2 to improve effect of identification.

This invention is applicable for identifying dynamic characteristic not only of artificial satellites but also of robots and other systems that measure positions, velocities, and acceleration.

In summary, the present invention determines the passband of a band-pass filter according to a result of spectrum analysis of such as an acceleration signal, velocity signal, position signal, and so on, of an object to be identified, and identifies oscillation modes of the object. Even with much observation noise occurring in a control system of the object, the frequency characteristics of the control system can be accurately, easily and speedily identified.

If a plurality of filters are used, the effect of the invention further improves.

Various modifications will become possible for those skilled in the art after receiving the teachings of the present disclosure without departing from the scope thereof.

What is claimed is:

1. A system identification apparatus for determining the dynamic characteristics of a system, comprising:
   identification signal input means for inputting an input signal to said system, said system outputting an output signal indicative of the position of said system in response to said input signal;
   a band-pass filter connected to said identification signal input means and said system for partially transmitting said input signal and said output signal in accordance with the passband of said band-pass filter;
   a sampler connected to said band-pass filter for sampling said input signal and said output signal from said band-pass filter at specified sampling intervals; and
   means connected to said sampler for calculating a transfer function from the samples of said input signals and said output signals,
   wherein the passband of said band-pass filter and the sampling interval of said sampler are determined by:
   means connected to said identification signal input means and said system for calculating a spectrum from said input signal and said output signal or a differential of said output signal; and
   means connected to said spectrum calculating means, said band-pass filter and said sampler for determining appropriate values of the passband of said band-pass filter and the sampling interval of said sampler in accordance with the spectrum;
   whereby the outputs of said band-pass filters and the sampling periods enable the identification of a system by transfer functions indicative of its characteristic oscillations.

2. The system identification apparatus as claimed in claim 1 wherein said input signal is an M-sequence (maximum period sequence) signal.

3. The system identification apparatus as claimed in claim 1 wherein said position of said system is angular.

4. The system identification apparatus as claimed in claim 1 wherein said spectrum calculating means calculates the spectrum in accordance with a fast Fourier transform method.

5. The system identification apparatus as claimed in claim 1 wherein the passband of said filter and the sampling interval of said sampler are determined in order that an oscillation mode appearing on the spectrum is included in the passband.

6. A system identification apparatus for calculating a transfer function of a system comprising:
   identification signal input means for inputting an identification input signal to said system which outputs an output signal indicative of a position of said system in response to said input signal;
   a plurality of band-pass filters connected to said identification signal input means and said system for partially transmitting said input signal and said output signal, respectively, in accordance with the passband of said band-pass filters;
   a plurality of samplers connected, respectively, to said band-pass filters for sampling said input signals from said filters and said output signals at sampling intervals; and means connected to said samplers for calculating a transfer function from sampled signals of said input signal and said output signal, wherein the passband of each of said filters is determined respectively by:

means connected to said identification signal input means and said system for calculating a spectrum from said input signal and a differential of said output signal; and means connected to said spectrum calculating means, each filter and the corresponding sampler for determining an appropriate passband of each filter in order that an oscillation mode appearing on the spectrum is included in the passband, and transfer functions uniquely identifying the system.

* * * * *